(12) United States Patent
Katagiri et al.

(10) Patent No.: US 11,515,689 B2
(45) Date of Patent: Nov. 29, 2022

(54) SEMICONDUCTOR LASER MODULE AND METHOD OF MANUFACTURING SEMICONDUCTOR LASER MODULE

(71) Applicant: FUJIKURA LTD., Tokyo (JP)

(72) Inventors: Ken Katagiri, Chiba (JP); Yohei Kasai, Chiba (JP)

(73) Assignee: Fujikura Ltd., Tokyo (JP)

( * ) Notice: Subject to any disclaimer, the term of this patent is extended or adjusted under 35 U.S.C. 154(b) by 195 days.

(21) Appl. No.: 16/958,355

(22) PCT Filed: Dec. 26, 2018

(86) PCT No.: PCT/JP2018/047911
§ 371 (c)(1),
(2) Date: Jun. 26, 2020

(87) PCT Pub. No.: WO2019/135379
PCT Pub. Date: Jul. 11, 2019

(65) Prior Publication Data
US 2021/0066891 A1 Mar. 4, 2021

(30) Foreign Application Priority Data
Jan. 4, 2018 (JP) .............................. JP2018-000069

(51) Int. Cl.
*H01S 5/02325* (2021.01)
*H01S 5/40* (2006.01)
(Continued)

(52) U.S. Cl.
CPC ............ *H01S 5/4031* (2013.01); *H01S 5/023* (2021.01); *H01S 5/0233* (2021.01);
(Continued)

(58) Field of Classification Search
CPC .... H01S 5/4031; H01S 5/02251; H01S 5/023; H01S 5/02325; H01S 5/0233;
(Continued)

(56) References Cited

U.S. PATENT DOCUMENTS 5,987,043 A 11/1999 Brown et al.
8,989,530 B2 3/2015 Chan
(Continued)

FOREIGN PATENT DOCUMENTS

CN 1868097 A 11/2006
CN 104112980 A 10/2014
(Continued)

OTHER PUBLICATIONS

Extended European Search Report issued in corresponding European Patent Application No. 18898328.2 dated Sep. 28, 2021 (10 pages).

*Primary Examiner* — Xinning(Tom) Niu
(74) *Attorney, Agent, or Firm* — Osha Bergman Watanabe & Burton LLP

(57) ABSTRACT

A semiconductor laser module includes: an optical fiber that outputs a first laser beam to an exterior of the semiconductor laser module; semiconductor laser devices each including an emission portion that emits a second laser beam, an electrically conductive portion that supplies electric power to the emission portion, and a mount on which the emission portion and the electrically conductive portion are disposed; a mount base including mount surfaces that form steps; and an optical system that optically couples the second laser beams from the emission portions to an incident end face of the optical fiber. The mounts of the semiconductor laser devices are disposed on the mount surfaces. The semiconductor laser devices include an upper semiconductor laser (Continued)

device and a lower semiconductor laser device adjacent to each other in a step direction of the mount base.

13 Claims, 8 Drawing Sheets

(51) Int. Cl.
 H01S 5/0235 (2021.01)
 H01S 5/02251 (2021.01)
 H01S 5/023 (2021.01)
 H01S 5/0233 (2021.01)

(52) U.S. Cl.
 CPC ........ *H01S 5/0235* (2021.01); *H01S 5/02251* (2021.01); *H01S 5/02325* (2021.01); *H01S 5/4012* (2013.01)

(58) Field of Classification Search
 CPC .. H01S 5/0235; H01S 5/4012; H01S 5/02253; H01S 5/02255; H01S 5/02315; H01S 5/02326; H01S 5/02375; H01S 5/02469; G02B 6/4296
 See application file for complete search history.

(56) References Cited

U.S. PATENT DOCUMENTS

| 2004/0114648 | A1* | 6/2004 | Nagano | H01S 5/405 |
| | | | | 372/36 |
| 2006/0285476 | A1 | 12/2006 | Watanabe et al. | |
| 2009/0034986 | A1 | 2/2009 | Yu | |
| 2009/0245315 | A1 | 10/2009 | Faybishenko | |
| 2015/0131692 | A1* | 5/2015 | Hayamizu | H01S 5/4012 |
| | | | | 372/107 |

FOREIGN PATENT DOCUMENTS

| JP | S60-063981 A | 4/1985 |
| JP | H08-274355 A | 10/1996 |
| JP | 2000-101182 A | 4/2000 |
| JP | 2004-179607 A | 6/2004 |
| JP | 2013-235943 A | 11/2013 |
| WO | 2017/007657 A1 | 1/2017 |

* cited by examiner

SEMICONDUCTOR LASER MODULE AND METHOD OF MANUFACTURING SEMICONDUCTOR LASER MODULE

CROSS-REFERENCE TO RELATED APPLICATIONS

This is a National Stage application of International Application No. PCT/JP2018/047911 filed Dec. 26, 2018, which claims priority to Japanese Patent Application No. 2018-000069 filed Jan. 4, 2018. These references are incorporated herein by reference in their entirety.

TECHNICAL FIELD

The present invention relates to a semiconductor laser module and a method of manufacturing a semiconductor laser module, and more particularly to a semiconductor laser module having a plurality of semiconductor laser devices.

BACKGROUND

As this type of semiconductor laser modules, there has heretofore been known a semiconductor laser module having a plurality of semiconductor laser devices mounted at different heights (see, e.g., Patent Literature 1). For example, as shown in FIG. 1, this semiconductor laser module 900 includes a plurality of semiconductor laser devices 910 and a stepped mount base 901 on which those semiconductor laser devices 910 are mounted. Each of the semiconductor laser devices 910 includes a semiconductor chip 911 that emits a laser beam and electrode pads 912 for supplying electric power to the semiconductor chip 911. The mount base 901 includes mount surfaces 904 arranged at different heights for mounting a plurality of semiconductor laser devices 910 and step side surfaces 905 that interconnect adjacent ones of the mount surfaces 904. With this configuration, a plurality of laser beams can be emitted at different heights, and those laser beams can be condensed so as to output a high-power laser beam.

However, if distances G between the electrode pads 912 and the step side surfaces 905 are short in this configuration of the semiconductor laser module 900, a dielectric breakdown may occur between the electrode pads 912 and the step side surfaces 905 when a voltage is applied to the semiconductor laser module 900. Accordingly, in order to prevent a dielectric breakdown, the distances G need to be increased to some extent in this semiconductor laser module 900. However, when the distances G are increased, the width L9 of the mount base 901 increases, resulting in an increased size of the module.

PATENT LITERATURE

Patent Literature 1: JP 2013-235943 A

SUMMARY

One or more embodiments of the present invention provide a semiconductor laser module that can achieve size reduction.

One or more embodiments of the present invention provide a method of manufacturing a semiconductor laser module that can achieve size reduction while generation of a dielectric breakdown is inhibited.

According to one or more embodiments of the present invention, there is provided a semiconductor laser module that can achieve size reduction. This semiconductor laser module has an optical fiber that outputs a laser beam to an exterior of the semiconductor laser module and a plurality of semiconductor laser devices. Each of the plurality of semiconductor laser devices includes an emission portion that emits the laser beam, an electrically conductive portion that supplies electric power to the emission portion, and a mount on which the emission portion and the electrically conductive portion are mounted. The semiconductor laser module also has a mount base having a plurality of mount surfaces on which the mounts of the plurality of semiconductor laser devices are mounted and an optical system that optically couples the laser beams from the emission portions to an incident end face of the optical fiber, wherein the plurality of mount surfaces are formed in a stepped manner. The plurality of semiconductor laser devices include an upper semiconductor laser device and a lower semiconductor laser device disposed adjacent to each other in a step direction of the mount base. A portion of the upper semiconductor laser device protrudes from the mount surface toward the lower semiconductor laser device.

According to such a semiconductor laser module, since a portion of the upper semiconductor laser device protrudes from the mount surface toward the lower semiconductor laser device, a distance between the lower semiconductor laser device and the upper semiconductor laser device is shortened. As a result, the mount base can be reduced in size, and hence the semiconductor laser module can be reduced in size.

According to the present invention, the semiconductor laser module is thus reduced in size. Therefore, the optical path length of a laser beam emitted from the semiconductor laser device that is located farthest from the incident end face of the optical fiber (i.e., the maximum optical path length) is shortened.

Meanwhile, the laser beam emitted from each of the semiconductor laser devices is collimated by a collimator lens. In practice, the laser beam that has passed through the collimator lens does not form completely parallel light and has a slight angle of divergence due to aberration and the like. Therefore, if the maximum optical path length increases, the "overall beam diameter" of a flux of laser beams from a plurality of semiconductor laser devices (overall laser beam) increases before the beam condensation. Thus, the overall beam diameter of the overall laser beam (spot diameter) also increases after the beam condensation. Accordingly, a portion of a laser beam component of the overall laser beam leaks out of a core of the optical fiber, resulting in coupling loss. In order to address such phenomena, it is conceivable that the curvature of a condenser lens is decreased to reduce the spot diameter. In such a case, a condensation angle of the condenser lens increases, so that coupling loss is caused by laser beam components that exceed the numerical aperture (NA) within which the optical fiber can receive light. As described above, as the maximum optical path length becomes longer, the coupling loss of the laser beam to the optical fiber increases.

In contrast, according to the semiconductor laser module of the present invention, the maximum optical path length is shortened as described above. Accordingly, the coupling efficiency of the laser beam to the optical fiber can be improved.

An inhibition space may be formed below the portion of the upper semiconductor laser device for inhibiting a dielectric breakdown from occurring between the mount base and the electrically conductive portion of the lower semiconductor laser device. The inhibition space may be formed such that the shortest separation distance from the mount base to the electrically conductive portion of the lower semiconductor laser device in the inhibition space is more than or equal to an inhibition distance with which a dielectric breakdown is inhibited from occurring between the electrically conductive portion and the mount base.

In this case, the inhibition distance Lc (mm) may be calculated by (or satisfy)

$$Lc \geq P/R$$

where P (kV) is a required withstand voltage of the semiconductor laser module, and R (kV/mm) is an insulation resistance of the inhibition space.

Furthermore, when the inhibition space is formed by air, the inhibition distance Lc may be calculated by $$Lc \geq P/3.$$

This configuration simultaneously achieves size reduction of the semiconductor laser module, improvement in coupling efficiency due to the size reduction, and inhibition of a dielectric breakdown in the module.

The mount surface of the mount base may extend to at least a location right below (i.e., directly below) the emission portion of the semiconductor laser device mounted on the mount surface. This configuration allows heat generated in the emission portion to be radiated to the mount base through the mount surface. Accordingly, the efficiency of heat dissipation of the semiconductor laser module is increased.

The mount base may further have a positioning structure that allows the plurality of semiconductor laser devices to be positioned such that the inhibition space is formed. This configuration facilitates formation of the inhibition space. For example, such a positioning structure includes a protrusion portion projecting upward from the mount surface so that the mount abuts on the protrusion portion. The mount base may have an inclination surface extending obliquely upward from the mount surface, and a boundary between the mount surface and the inclination surface may be used for the positioning structure.

According to one or more embodiments of the present invention, there is provided a method of manufacturing a semiconductor laser module that can achieve size reduction while generation of a dielectric breakdown is inhibited. In this manufacturing method, a mount base having a plurality of mount surfaces including an upper mount surface and a lower mount surface located adjacent to each other in a step direction is first prepared, wherein the plurality of mount surfaces are formed in a stepped manner. An upper semiconductor laser device to be mounted on the upper mount surface and a lower semiconductor laser device to be mounted on the lower mount surface are prepared. Then the lower semiconductor laser device is placed and fixed onto the lower mount surface so that an inhibition space is formed between the mount base and an electrically conductive portion of the lower semiconductor laser device for inhibiting a dielectric breakdown from occurring between the electrically conductive portion and the mount base. The upper semiconductor laser device is placed and fixed onto the upper mount surface so that a portion of the upper semiconductor laser device protrudes from the upper mount surface toward the lower semiconductor laser device.

In the above manufacturing method, a positioning structure may be provided on the plurality of mount surfaces for positioning the plurality of semiconductor laser devices so that the inhibition space is formed. This configuration allows the semiconductor laser device to abut on the positioning structure. Accordingly, the inhibition space can readily be formed.

After the upper semiconductor laser device is placed on the upper mount surface and the lower semiconductor laser device is placed on the lower mount surface, the mount base may be inclined so as to bring the upper semiconductor laser device and the lower semiconductor laser device into abutment on the positioning structure. While the abutment state is maintained, the upper semiconductor laser device and the lower semiconductor laser device may be fixed to the plurality of mount surfaces. This configuration allows a plurality of semiconductor laser devices to be positioned collectively and also to be fixed to the mount base simultaneously. Accordingly, a semiconductor laser module that can achieve size reduction while generation of a dielectric breakdown is inhibited can more readily be manufactured.

According to the present invention, since a portion of the upper semiconductor laser device protrudes from the mount surface toward the lower semiconductor laser device, a distance between the upper semiconductor laser device and the lower semiconductor laser device is shortened, so that size reduction of the semiconductor laser module can be achieved.

DETAILED DESCRIPTION

Figure 1:
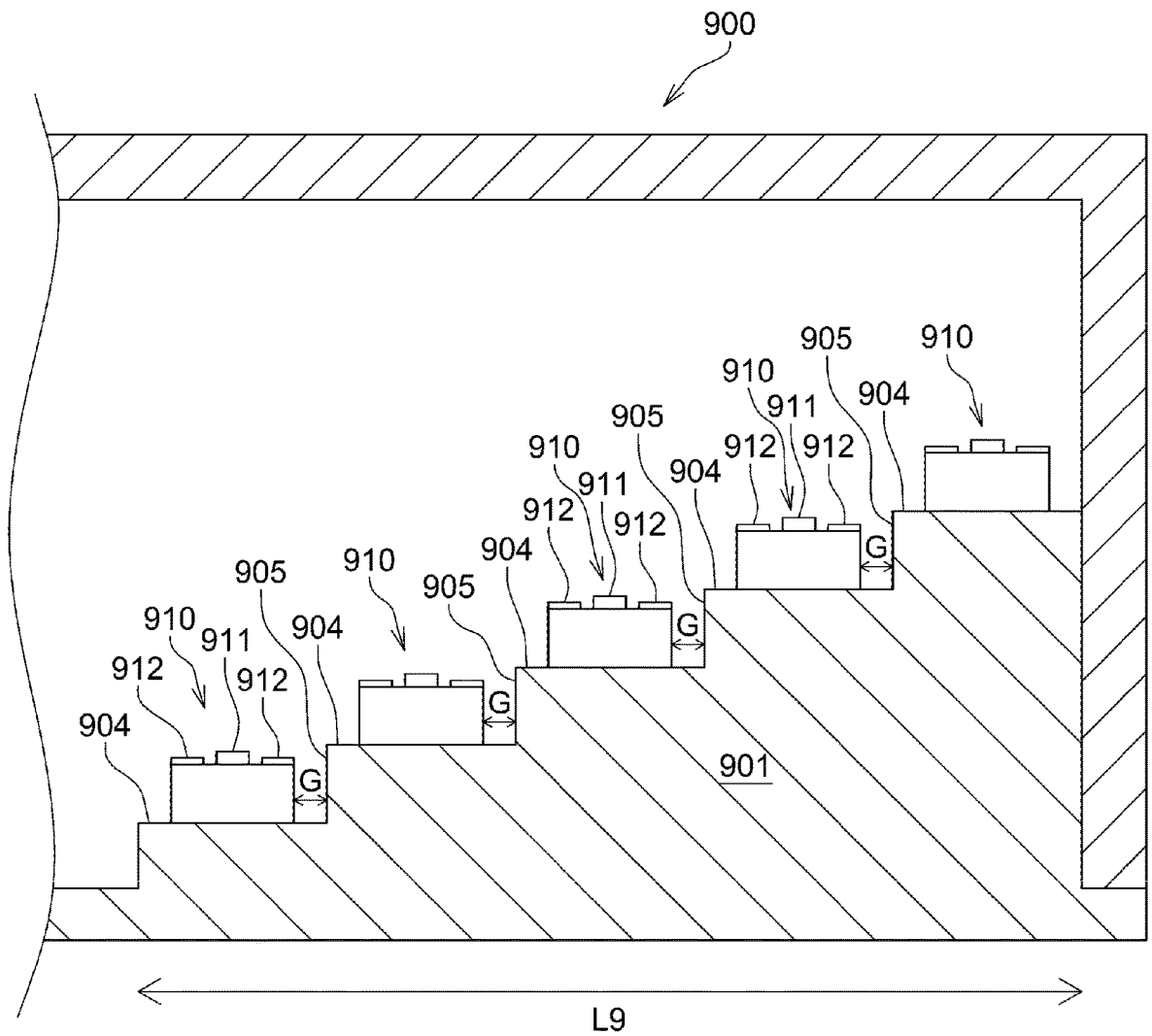
FIG. 1 is a partial cross-sectional view showing a conventional semiconductor laser module.

Embodiments of a semiconductor laser module according to the present invention will be described in detail below with reference to FIGS. 2 to 8. In FIGS. 2 to 8, the same or corresponding components are denoted by the same or corresponding reference numerals and will not be described below repetitively. Furthermore, in FIGS. 2 to 8, the scales or dimensions of components may be exaggerated, or some components may be omitted.

Figure 2:
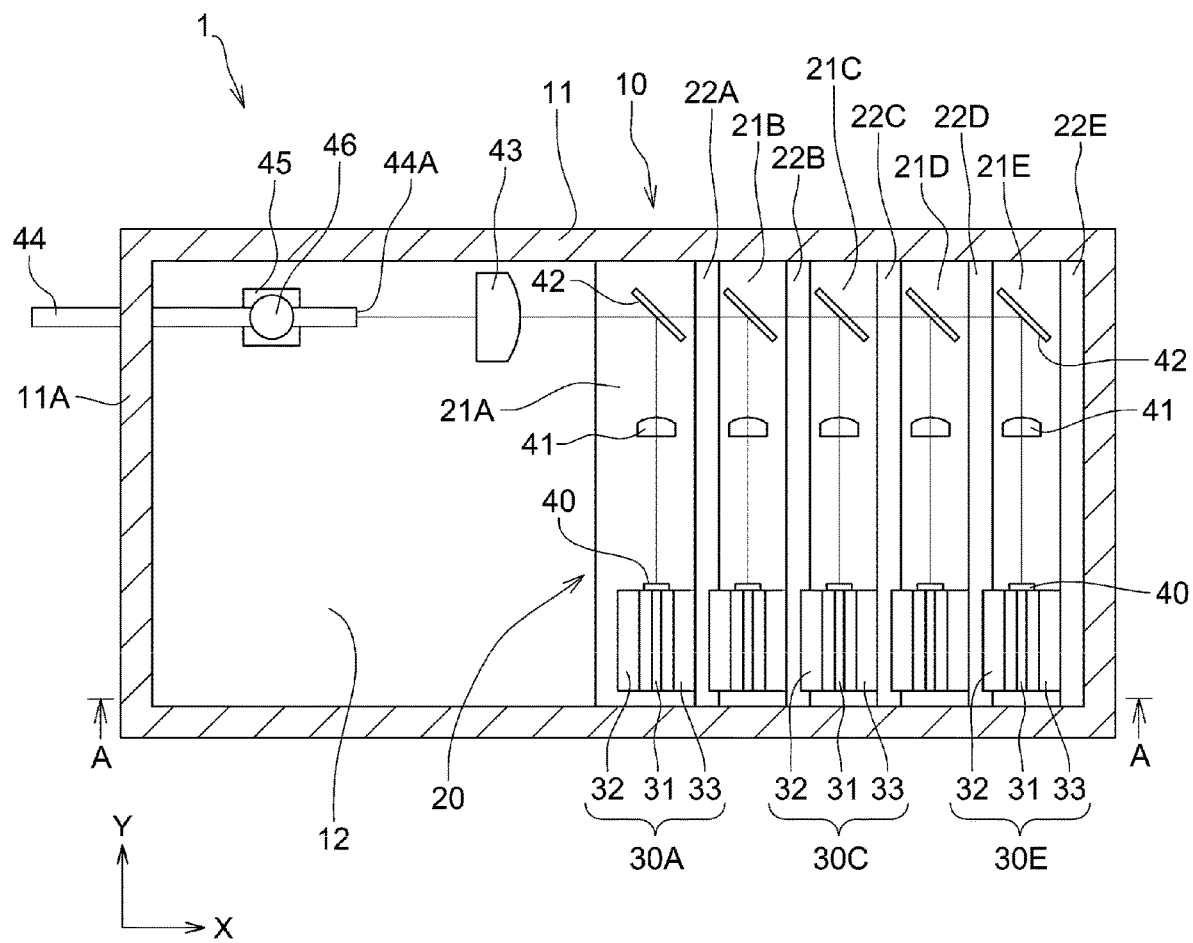
FIG. 2 is a partially cross-sectional plan view showing a semiconductor laser module according to one or more embodiments of the present invention.
Figure 3:
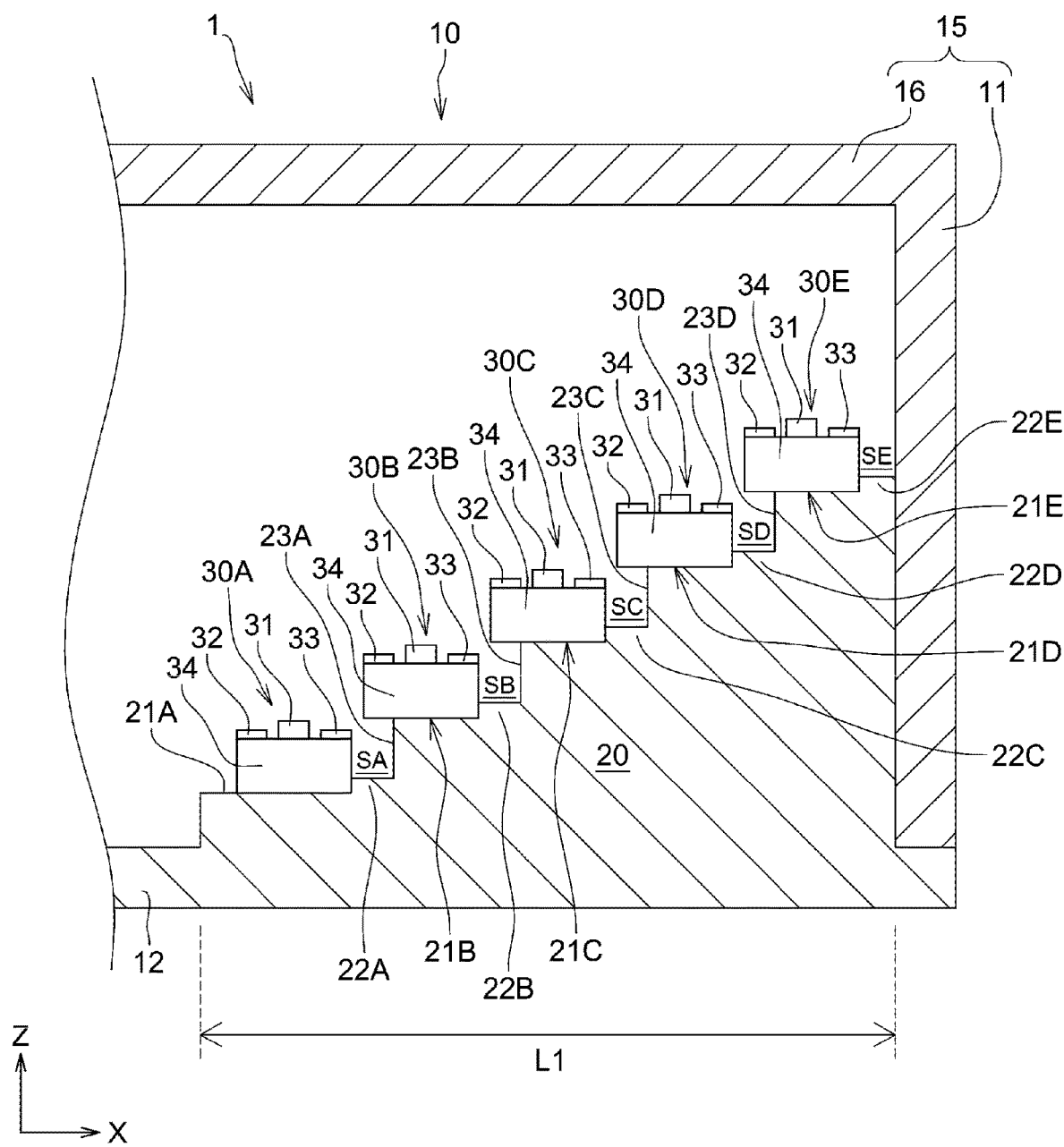
FIG. 3 is a partially cross-sectional view taken along line A-A of FIG. 2, which shows only the vicinity of a mount base of the semiconductor laser module illustrated in FIG. 1.

FIG. 2 is a partially cross-sectional plan view showing a semiconductor laser module 1 according to one or more embodiments of the present invention, and FIG. 3 is a partially cross-sectional view taken along line A-A of FIG. 2, which shows only the vicinity of a mount base 20 of the semiconductor laser module 1.

As shown in FIGS. 2 and 3, the semiconductor laser module 1 has a plurality of semiconductor laser devices 30A-30E (five semiconductor laser devices shown in the figures), fast-axis collimator lenses 40 and slow-axis collimator lenses 41, which are provided so as to correspond to the respective semiconductor laser devices 30A-30E, reflection mirrors 42 that reflect laser beams from the semiconductor laser devices 30A-30E, a condenser lens 43 that condenses a plurality of laser beams reflected on the reflection mirrors 42, an optical fiber 44 that outputs a laser beam condensed by the condenser lens 43 to an exterior of the semiconductor laser module 1, and a housing 10 that houses the semiconductor laser devices, the lenses, and the mirrors therein. In FIG. 3, for the sake of clarity, the slow-axis collimator lenses 41, the reflection mirrors 42, and the like are omitted from the illustration.

As shown in FIGS. 2 and 3, the housing 10 includes a bottom plate 12 having a generally rectangular shape with longitudinal sides extending along the X-direction, a frame 11 fixed to a peripheral portion of the bottom plate 12, and a cover body 16 fixed to a surface of the frame 11 on the +Z side. In one or more embodiments, the bottom plate 12 is formed of a metal having a good thermal conductivity (e.g., copper). The frame 11 and the cover body 16 are formed integrally with each other to constitute a cover member 15.

Hereinafter, the +Z side, i.e., the side that is relatively farther from the bottom plate 12, may be referred to as "upper," "upward," or "upper side." The −Z side, i.e., the side that is relatively closer to the bottom plate 12, may be referred to as "lower," "downward," or "lower side."

As shown in FIG. 2, the optical fiber 44 is provided on the −X side of the bottom plate 12 and in the vicinity of an end of the bottom plate 12 along the +Y-direction. This optical fiber 44 is fixed to a fiber mount 45 mounted on the bottom plate 12 by, for example, solder 46. The optical fiber 44 extends to an exterior of the semiconductor laser module 1 through a wall 11A of the frame 11 of the housing 10 on the −X side.

As shown in FIGS. 2 and 3, a mount base 20 is formed over a substantially right half of the bottom plate 12 (+X side). The height of the mount base 20 increases in a stepped manner toward the +X-direction. This mount base 20 includes five mount surfaces 21A-21E, which are parallel to the XY-plane. More specifically, as shown in FIG. 3, the mount base 20 includes a mount surface 21A that is located at the lowermost position in height from the bottom plate 12 along the Z-direction (step direction), a mount surface 21B located adjacent to and on an upper side of the mount surface 21A, a mount surface 21C located adjacent to and on an upper side of the mount surface 21B, a mount surface 21D located adjacent to and on an upper side of the mount surface 21C, and a mount surface 21E located adjacent to and on an upper side of the mount surface 21D.

Hereinafter, the +X side may be referred to as "right," or "right side," whereas the −X side may be referred to as "left," or "left side."

As shown in FIG. 2, one of the semiconductor laser devices 30A-30E, the fast-axis collimator lens 40, the slow-axis collimator lens 41, and the reflection mirror 42 are arranged from the −Y side to the +Y side and fixed on each of the mount surfaces 21A-21E (for example, the semiconductor laser device 30A is fixed on the mount surface 21A, and the semiconductor laser device 30C is fixed on the mount surface 21C).

As shown in FIG. 3, each of the semiconductor laser devices 30A-30E includes a semiconductor chip 31 (emission portion) that emits a laser beam, a pair of electrode pads for supplying electric power to the semiconductor chip 31 (i.e., a left electrode pad 32 (electrically conductive portion) located on the left side of the semiconductor chip 31 and a right electrode pad 33 (electrically conductive portion) located on the right side of the semiconductor chip 31), and a mount 34 on which the semiconductor chip 31 and the electrode pads 32 and 33 are mounted. This mount 34 is formed of a material having good insulation properties. In one or more embodiments, the mount 34 is formed of aluminum nitride.

The direction perpendicular to the pn junction of a semiconductor laser device is referred to as a fast axis, and the direction parallel to the pn junction of the semiconductor laser device is referred to as a slow axis. The degree of divergence of light from a semiconductor laser device is much greater along the fast axis than that along the slow axis. Therefore, laser beams emitted from the semiconductor laser devices 30A-30E widely spread along the fast axis. In one or more embodiments, the fast axis of the laser beams emitted from the semiconductor laser devices 30A-30E extends along the Z-direction of FIG. 3, and the slow axis of the laser beams extends along the X-direction. Accordingly, as shown in FIG. 2, the fast-axis collimator lenses 40 are provided adjacent to the semiconductor laser devices 30A-30E. Thus, each of the fast-axis collimator lenses 40 collimates a laser beam originating from the adjacent semiconductor laser device and spreading along the fast axis (Z-direction). Meanwhile, each of the slow-axis collimator lenses 41 is provided between the fast-axis collimator lens 40 and the reflection mirror 42 in the laser emission direction (Y-direction). Thus, the laser beams that have been collimated along the fast axis are further collimated along the slow axis (X-direction) by the slow-axis collimator lenses 41.

As shown in FIG. 2, the five reflection mirrors 42 are arranged on the +Y side of the slow-axis collimator lenses 41 along a line extending in the X-direction. Each of those reflection mirrors 42 is arranged so as to change the direction of a laser beam propagating along the +Y-direction by 90°. Therefore, each of the laser beams emitted from the semiconductor chips 31 and collimated by the collimator lenses 40 and 41 is reflected on the reflection mirror 42 located frontward, so that the direction of the laser beam changes into the −X-direction. Thus, a plurality of laser beams are introduced into the condenser lens 43 at different positions in the Z-direction.

The condenser lens 43 serves to condense the laser beams in the Y-direction and the Z-direction and has an optical axis extending along the X-direction. This condenser lens 43 is optically aligned in the X-direction, the Y-direction, and the Z-direction and positioned with high precision in the X-direction, the Y-direction, and the Z-direction. Therefore, a plurality of laser beams that have passed through the condenser lens 43 are positioned with high precision in the X-direction, the Y-direction, and the Z-direction and are thus condensed onto an end face 44A (incident end face 44A) of the optical fiber 44 on the +X side. As a result, a plurality of laser beams condensed onto the incident end face 44A of the optical fiber 44 are optically coupled to the incident end face 44A of the optical fiber 44 and outputted to an exterior of the semiconductor laser module 1 through the optical fiber 44.

As described above, according to the semiconductor laser module 1, laser beams from a plurality of semiconductor laser devices 30A-30E can be condensed onto the incident end face 44A of the optical fiber 44 by using an optical system including the collimator lenses 40 and 41, the reflection mirrors 42, and the condenser lens 43. Thus, an output of the semiconductor laser module 1 can be increased. However, if an optical path length from the semiconductor chip 31 to the incident end face 44A increases, then coupling loss may be caused on the incident end face 44A to exert adverse influence on the output of the semiconductor laser module 1. The present invention is to deal with such a phenomenon in an effective manner by reducing the size of the semiconductor laser module. Now the features of the present invention will be described in detail.

As shown in FIG. 3, the mount base 20, on which a plurality of semiconductor laser devices 30A-30E (five semiconductor laser devices 30A-30E) are mounted, has five mount surfaces 21A-21E on which the semiconductor laser devices 30 are fixed and protrusion portions 22A-22E projecting upward from right edges of the respective mount surfaces 21A-21E.

As shown in FIG. 3, a step side surface 23A extends upward from the right edge of the protrusion portion 22A and connects to the mount surface 21B, which is located at the second lowermost position. Similarly, a step side surface 23B extends upward from the right edge of the protrusion portion 22B and connects to the mount surface 21C, which is located at the third lowermost position, and a step side surface 23C extends upward from the right edge of the protrusion portion 22C and connects to the mount surface 21D, which is located at the fourth lowermost position. A step side surface 23D extends upward from the right edge of the protrusion portion 22D and connects to the mount surface 21E, which is located at the fifth lowermost position. Furthermore, the right edge of the protrusion portion 22E forms a portion of the right edge of the mount base 20 and abuts on the frame 11 of the housing 10.

Figure 4:
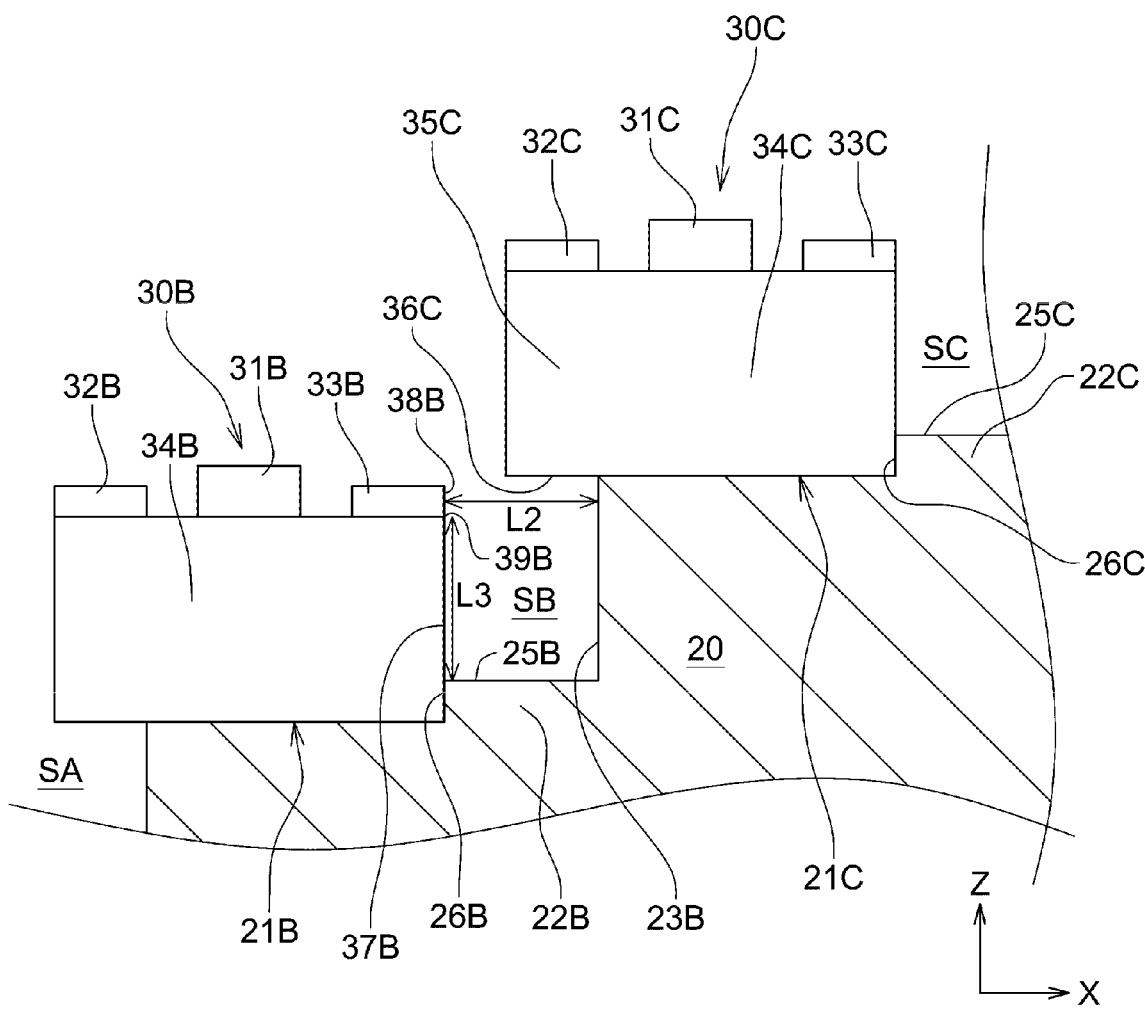
FIG. 4 is an enlarged cross-sectional view showing a portion of the mount base illustrated in FIG. 3.

FIG. 4 is an enlarged cross-sectional view showing the vicinity of the semiconductor laser devices 30B and 30C located adjacent to each other in the Z-direction. As shown in FIG. 4, the semiconductor laser device 30B, which is mounted on the mount surface 21B located at the second lowermost position, and the semiconductor laser device 30C, which is mounted on the mount surface 21C located adjacent to and on an upper side of the mount surface 21B, are disposed adjacent to each other in the Z-direction (step direction). Specifically, the semiconductor laser device 30B is referred to as a semiconductor laser device located on a relatively lower side in a pair of semiconductor laser devices 30B and 30C disposed adjacent to each other in the Z-direction, i.e., a lower semiconductor laser device. The semiconductor laser device 30C is referred to as a semiconductor laser device located on a relatively upper side in the pair of semiconductor laser devices 30B and 30C, i.e., an upper semiconductor laser device.

When an attention is directed to other pairs of semiconductor laser devices disposed adjacent to each other in the Z-direction, for example, when an attention is directed to a pair of semiconductor laser devices 30C and 30D, as shown in FIG. 3, the semiconductor laser device 30C can be referred to as a lower semiconductor laser device, and the semiconductor laser device 30D can be referred to as an upper semiconductor laser device.

As shown in FIG. 4, the protrusion portion 22B has a side surface 26B that is parallel to the YZ-plane and abuts on the mount 34B of the lower semiconductor laser device 30B and an upper surface 25B that is parallel to the XY-plane and connects the side surface 26B and the step side surface 23B to each other. Similarly, the protrusion portion 22C has a side surface 26C that is parallel to the YZ-plane and abuts on the mount 34C of the upper semiconductor laser device 30C and an upper surface 25C that is parallel to the XY-plane and connects the side surface 26C and the step side surface 23C (see FIG. 3) to each other.

As shown in FIG. 4, the mount 34C of the upper semiconductor laser device 30C abuts the side surface 26C of the protrusion portion 22C, so that the mount 34C of the upper semiconductor laser device 30C is positioned in the X-direction. The length of the mount surface 21C as measured in the X-direction, i.e., the length from the side surface 26C to the step side surface 23B as measured in the X-direction, is shorter than the length of the mount 34C of the upper semiconductor laser device 30C as measured in the X-direction. Therefore, a left portion 35C of the mount 34C protrudes from the mount surface 21C by a certain distance. Thus, the protrusion portion 22C serves as a positioning structure that allows the upper semiconductor laser device 30C to be positioned so as to protrude from the mount surface 21C.

Furthermore, as shown in FIG. 4, the mount 34B of the lower semiconductor laser device 30B abuts on the side surface 26B of the protrusion portion 22B, so that the mount 34B of the lower semiconductor laser device 30B is positioned in the X-direction. More specifically, the lower semiconductor laser device 30B is positioned such that a right side surface 38B of the right electrode pad 33B of the lower semiconductor laser device 30B is spaced from the step side surface 23B in the X-direction by a distance L2 and that a bottom 39B of the right side surface 38B is spaced from the upper surface 25B of the protrusion portion 22B in the Z-direction by a distance L3. Thus, the protrusion portion 22B serves as a positioning structure that allows the lower semiconductor laser device 30B to be positioned as described above.

As shown in FIG. 4, the distance L2 is the shortest separation distance from the right electrode pad 33B of the lower semiconductor laser device 30B to the step side surface 23B (mount base 20). The distance L3 is the shortest separation distance from the right electrode pad 33B to the upper surface 25B (mount base 20) of the protrusion portion 22B.

With the configuration described above, as shown in FIG. 4, a space SB is defined right below the upper semiconductor laser device 30C (the left portion 35C of the mount 34C) by a bottom surface 36C of the left portion 35C, the step side surface 23B, the upper surface 25B of the protrusion portion 22B, a right side surface 37B of the mount 34B of the lower semiconductor laser device 30B, and the right side surface 38B of the right electrode pad 33B of the lower semiconductor laser device 30B. The left portion 35C of the mount 34C of the upper semiconductor laser device 30C protrudes above the space SB. In other words, the left portion 35C as a portion of the upper semiconductor laser device 30C protrudes from the mount surface 21C toward the lower semiconductor laser device 30B.

As shown in FIG. 3, spaces SA, SC, and SD are formed right below the upper semiconductor laser devices in the other pairs of semiconductor laser devices. Portions of the semiconductor laser devices 30B, 30D, and 30E protrude above those spaces SA, SC, and SD.

As described above, since a portion of each of a plurality of upper semiconductor laser devices protrudes above the space SA-SD (i.e., it protrudes toward the lower semiconductor laser device), the separation distance between the upper semiconductor laser device and the lower semiconductor laser device as measured in the X-direction is reduced as compared to that of the conventional semiconductor laser module 900 (see FIG. 1). Thus, according to one or more embodiments, the width L1 of the mount base 20 (see FIG. 3) is smaller than the width L9 of the mount base 901 of the conventional semiconductor laser module 900 (see FIG. 1). Accordingly, the semiconductor laser module can be reduced in size.

The size reduction of the semiconductor laser module shortens an optical path length of the laser beam from the semiconductor laser device 30E that is located farthest from the incident end face 44A (maximum optical path length) as compared to that of the conventional semiconductor laser module (see FIG. 1). Therefore, the coupling efficiency of the laser beam to the optical fiber can be improved, so that the output of the semiconductor laser module can effectively be increased.

Meanwhile, referring again to FIG. 4, if a certain distance is not maintained between the step side surface 23B and the right electrode pad 33B of the lower semiconductor laser device 30B, then a dielectric breakdown may occur between the right electrode pad 33B and the step side surface 23B of the mount base 20. Accordingly, in one or more embodiments, the shortest separation distance L2 between the right electrode pad 33B and the step side surface 23B is set to be more than or equal to an inhibition distance with which a dielectric breakdown is inhibited from occurring between the right electrode pad 33B and the step side surface 23B.

Similarly, if a certain distance is not maintained between the upper surface 25B of the protrusion portion 22B and the right electrode pad 33B, then a dielectric breakdown may occur between the right electrode pad 33B and the upper surface 25B of the mount base 20. Accordingly, in one or more embodiments, the shortest separation distance L3 between the right electrode pad 33B and the upper surface 25B is set to be more than or equal to an inhibition distance with which a dielectric breakdown is inhibited from occurring between the right electrode pad 33B and the upper surface 25B.

For example, such an inhibition distance Lc can be calculated by the following formula. Specifically, the inhibition distance Lc (mm) is calculated by $$Lc \geq P/R \tag{1}$$

where P (kV) is a required withstand voltage of the semiconductor laser module 1, and R (kV/mm) is an insulation resistance of the space SB (a voltage with which a dielectric breakdown occurs).

When the space SB is formed by air, the inhibition distance can be calculated by $$Lc \geq P/3 \tag{2}$$

as the insulation resistance of air is 3 kV/mm.

As a matter of course, the inhibition distance may be calculated by other formulas.

In one or more embodiments, the distances L2 and L3 are the same and are more than or equal to the inhibition distance Lc calculated by the formula (1) or (2). Accordingly, the space SB serves as an inhibition space for inhibiting a dielectric breakdown from occurring between the right electrode pad 33B and the step side surface 23B and for inhibiting a dielectric breakdown from occurring between the right electrode pad 33B and the upper surface 25B of the protrusion portion 22B. In other words, the space SB serves as an inhibition space for inhibiting a dielectric breakdown from occurring between the right electrode pad 33B and the mount base 20.

As shown in FIG. 3, the spaces SA, SC, and SD located right below the upper semiconductor laser devices in the other pairs of semiconductor laser devices serve as inhibition spaces with a similar configuration to the space SB. The semiconductor laser device 30E, which is located at the uppermost position, is positioned in the X-direction by the protrusion portion 22E. Thus, a space SE formed between the semiconductor laser device 30E and the frame 11 serves as an inhibition space.

As described above, according to the semiconductor laser module 1 according to one or more embodiments, the inhibition spaces SA-SD are formed between the lower semiconductor laser devices and the step side surfaces (mount base) located adjacent to the lower semiconductor laser devices on the +X side. Accordingly, a dielectric breakdown is inhibited from occurring between the mount base and the electrode pads (see FIG. 3).

In this manner, according to the semiconductor laser module 1 according to one or more embodiments, size reduction and increased output of the semiconductor laser module can be achieved while a dielectric breakdown is inhibited from occurring between the mount base and the semiconductor laser devices.

As shown in FIG. 4, the mount surface 21C on which the upper semiconductor laser device 30C is mounted may extend to at least a location right below the semiconductor chip 31C of the upper semiconductor laser device 30C. This configuration allows heat generated in the semiconductor chip 31C to be radiated to the mount base 20 (copper) through the mount surface 21C located right below the semiconductor chip 31C. Accordingly, heat dissipation of the semiconductor laser module 1 can be performed effectively. This holds true for the mount surfaces 21B, 21D, and 21E.

Figure 5:
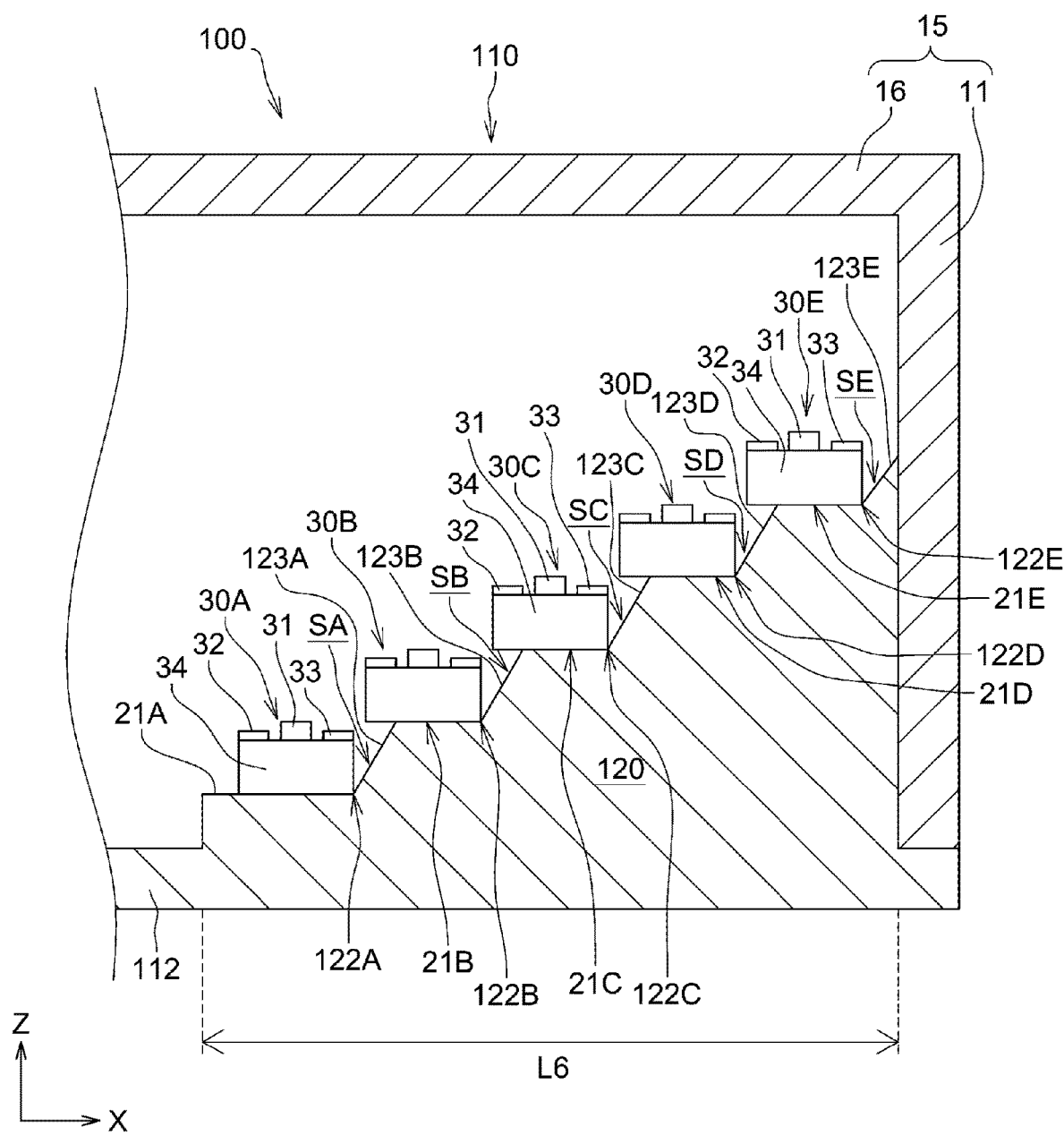
FIG. 5 is a cross-sectional view showing a semiconductor laser module according to one or more embodiments of the present invention, which corresponds to FIG. 3.

Furthermore, the positioning structure is not limited to the protrusion portion according to the above described embodiments and may be configured by one or more embodiments as described below. FIG. 5 is a cross-sectional view showing a semiconductor laser module 100 according to one or more embodiments of the present invention, which corresponds to FIG. 3.

As shown in FIG. 5, the semiconductor laser module 100 has semiconductor laser devices 30A-30E and a housing 110 that houses the semiconductor laser devices 30A-30E and the like. The housing 110 includes a bottom plate 112 having a generally rectangular shape with longitudinal sides extending along the X-direction and a cover member 15 fixed to a peripheral portion of the bottom plate 112. The bottom plate 112 is formed of copper as with the embodiments described above.

A mount base 120 is formed over a substantially right half of the bottom plate 112. The height of the mount base 120 increases in a stepped manner toward the +X-direction. This mount base 120 includes five mount surfaces 21A-21E, which are parallel to the XY-plane. One of the semiconductor laser devices 30A-30E, a fast-axis collimator lens 40, a slow-axis collimator lens 41, and a reflection mirror 42 are fixed on each of the mount surfaces 21A-21E (see FIG. 2).

As shown in FIG. 5, the mount base 120 includes five mount surfaces 21A-21E on which the semiconductor laser devices 30A-30E are fixed and inclination surfaces 123A-123E extending obliquely upward from respective right edges 122A-122E of the mount surfaces 21A-21E to the right side. More specifically, the mount base 120 includes an inclination surface 123A extending obliquely upward from a right edge 122A of the mount surface 21A to the right side, an inclination surface 123B extending obliquely upward from a right edge 122B of the mount surface 21B to the right side, an inclination surface 123C extending obliquely upward from a right edge 122C of the mount surface 21C to the right side, an inclination surface 123D extending obliquely upward from a right edge 122D of the mount surface 21D to the right side, and an inclination surface 123E extending obliquely upward from a right edge 122E of the mount surface 21E to the right side.

The inclination surface 123A connects to a left edge of the mount surface 21B that is located at the second lowermost position. The inclination surface 123B connects to a left edge of the mount surface 21C that is located at the third lowermost position. The inclination surface 123C connects to a left edge of the mount surface 21D that is located at the fourth lowermost position. The inclination surface 123D connects to a left edge of the mount surface 21E that is located at the uppermost position. The inclination surface 123E extends to the frame 11, which is located adjacent to the inclination surface 123E.

Figure 6:
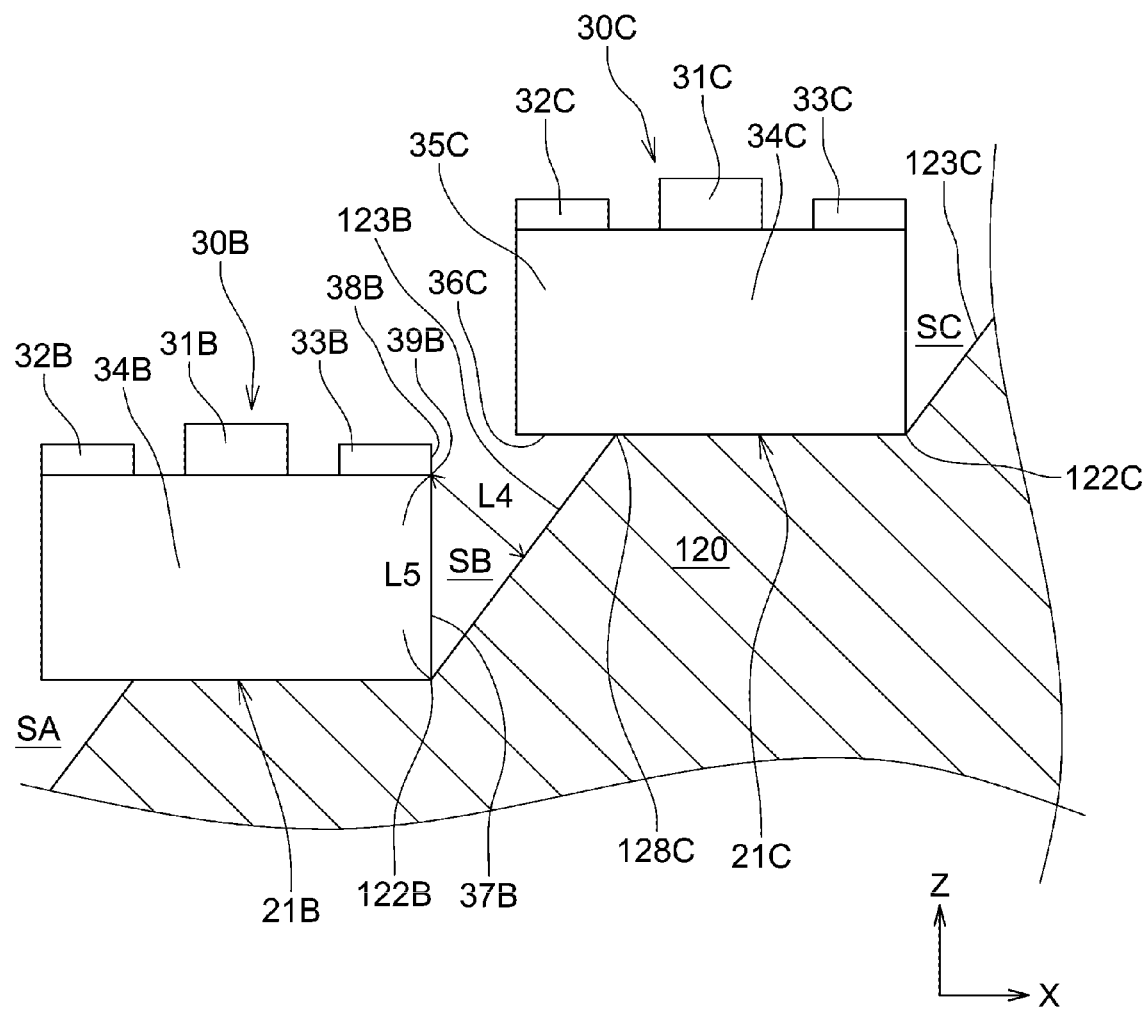
FIG. 6 is a view showing a portion of a mount base of the semiconductor laser module illustrated in FIG. 5.

FIG. 6 is an enlarged view showing the vicinity of the semiconductor laser device 30B (lower semiconductor laser device), which is mounted on the second lowermost mount surface 21B, and the semiconductor laser device 30C (upper semiconductor laser device), which is mounted on the mount surface 21C located adjacent to and on an upper side of the mount surface 21B.

As shown in FIG. 6, the mount 34C of the upper semiconductor laser device 30C is positioned in the X-direction by the right edge 122C of the mount surface 21C (i.e., the boundary 122C between the mount surface 21C and the inclination surface 123C). The length of the mount surface 21C as measured in the X-direction, i.e., the length from the boundary 122C to the left edge 128C, is shorter than the length of the mount 34C as measured in the X-direction. Therefore, a left portion 35C of the mount 34C protrudes from the mount surface 21C by a certain distance. Thus, the boundary 122C serves as a positioning structure that allows a portion (left portion 35C) of the upper semiconductor laser device 30C to be positioned so as to protrude from the mount surface 21C.

Furthermore, as shown in FIG. 6, the lower semiconductor laser device 30B (mount 34B) is positioned in the X-direction by the right edge 122B of the mount surface 21B (i.e., the boundary 122B between the mount surface 21B and the inclination surface 123B). More specifically, the lower semiconductor laser device 30B is positioned such that the bottom 39B of the right side surface 38B of the right electrode pad 33B is spaced from the inclination surface 123B by a distance L4 as measured along a perpendicular line to the inclination surface 123B and that the bottom 39B is spaced from the boundary 122B in the Z-direction by a distance L5. Thus, the boundary 122B serves as a positioning structure that allows the lower semiconductor laser device 30B to be positioned as described above.

As shown in FIG. 6, the distance L4 is the shortest separation distance from the right electrode pad 33B of the lower semiconductor laser device 30B to the inclination surface 123B. The distance L5 is the shortest separation distance from the right electrode pad 33B to the boundary 122B.

With the configuration described above, as shown in FIG. 6, a space SB is defined right below the upper semiconductor laser device 30C (the left portion 35C of the mount 34C) by the bottom surface 25C of the left portion 35C, the inclination surface 123B, the right side surface 37B of the mount 34B of the lower semiconductor laser device 30B, and the right side surface 38B of the right electrode pad 33B of the lower semiconductor laser device 30B.

In one or more embodiments, the shortest separation distance L4 is set to be more than or equal to a length with which a dielectric breakdown is inhibited from occurring between the right electrode pad 33B and the inclination surface 123B, i.e., an inhibition distance Lc calculated from the aforementioned formula (1) or (2). Furthermore, as shown in FIG. 6, the shortest separation distance L5 is longer than the shortest separation distance L4.

Accordingly, the space SB serves as an inhibition space for inhibiting a dielectric breakdown from occurring between the right electrode pad 33B and the inclination surface 123B and for inhibiting a dielectric breakdown from occurring between the right electrode pad 33B and the boundary 122B. As shown in FIG. 6, according to one or more embodiments, such an inhibition space SB is formed right below the upper semiconductor laser device 30C.

As shown in FIG. 5, the spaces SA, SC, and SD also serve as inhibition spaces as with the space SB. Those spaces are formed right below the respective upper semiconductor laser devices. Thus, portions of the upper semiconductor laser devices protrude above the spaces SA, SC, and SD. The semiconductor laser device 30E is positioned by the boundary 122E. A space SE formed between the right electrode pad 33 of the semiconductor laser device 30E and the frame 11 serves as an inhibition space.

With the aforementioned configuration, the width L6 of the mount base 120 (see FIG. 5) can be made smaller than the width L9 of the mount base 901 of the semiconductor laser module 900 (see FIG. 1) as with the embodiments described above. Accordingly, the semiconductor laser module can be reduced in size. Thus, one or more embodiments of the present invention also provide a small-sized, high-power semiconductor laser module in which a dielectric breakdown is unlikely to occur.

The positioning structures described in the aforementioned embodiments may be used simultaneously. Alternatively, other positioning structures may be used. Rather, such positioning structures may not necessarily be provided in the mount base. Provision of a positioning structure facilitates production of a semiconductor laser module that can achieve both of size reduction and inhibition of a dielectric breakdown. This feature will be described below with an example in which a semiconductor laser module 1 is manufactured.

Figure 7:
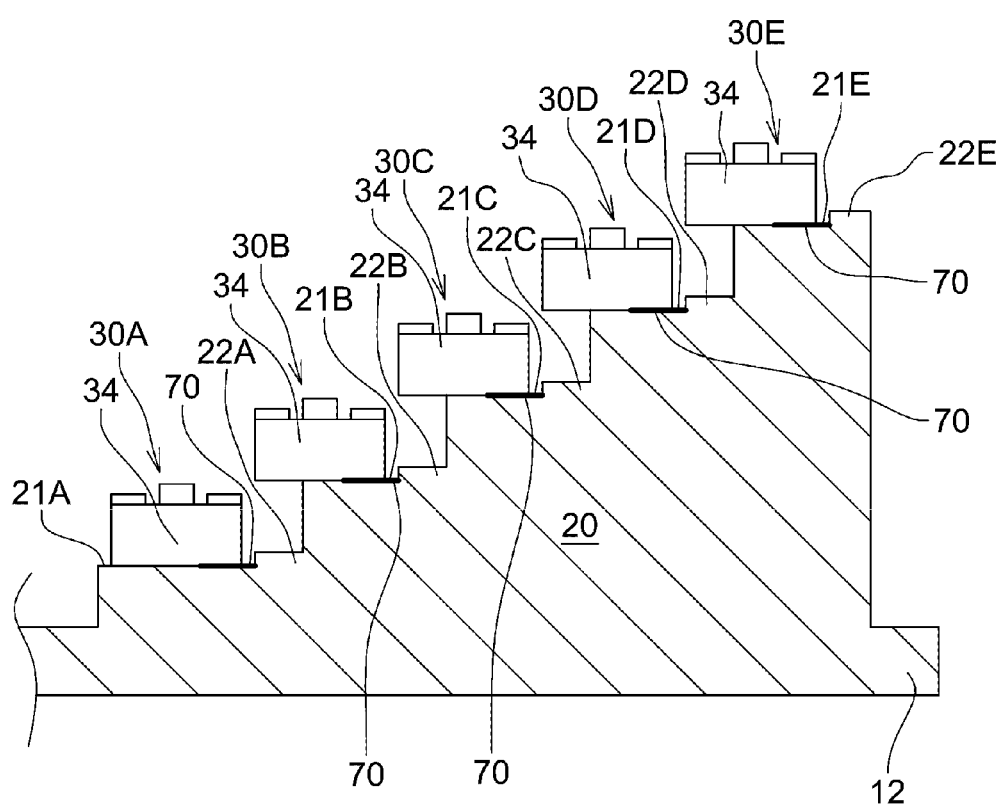
FIG. 7 is a diagram showing a manufacturing method of the semiconductor laser module illustrated in FIG. 2.

In order to manufacture a semiconductor laser module 1, as shown in FIG. 7, a bottom plate 12 having a mount base 20 formed thereon is prepared in the first place. Protrusion portions 22A-22E are formed as the aforementioned positioning structures in the mount base 20. Then, as shown in FIG. 7, a solder sheet 70 is formed over a certain area of the mount surface 21A that is adjacent to the protrusion portion 22A. More specifically, the solder sheet 70 is formed over an area sufficient to bond the mount 34 of the semiconductor laser device 30A to the mount surface 21A. Solder sheets 70 are also formed on the mount surfaces 21B-21E as with the mount surface 21A. Thereafter, as shown in FIG. 7, the semiconductor laser devices 30A-30E are respectively placed on the mount surfaces 21A-21E on which the solder sheets 70 have been formed.

Figure 8:
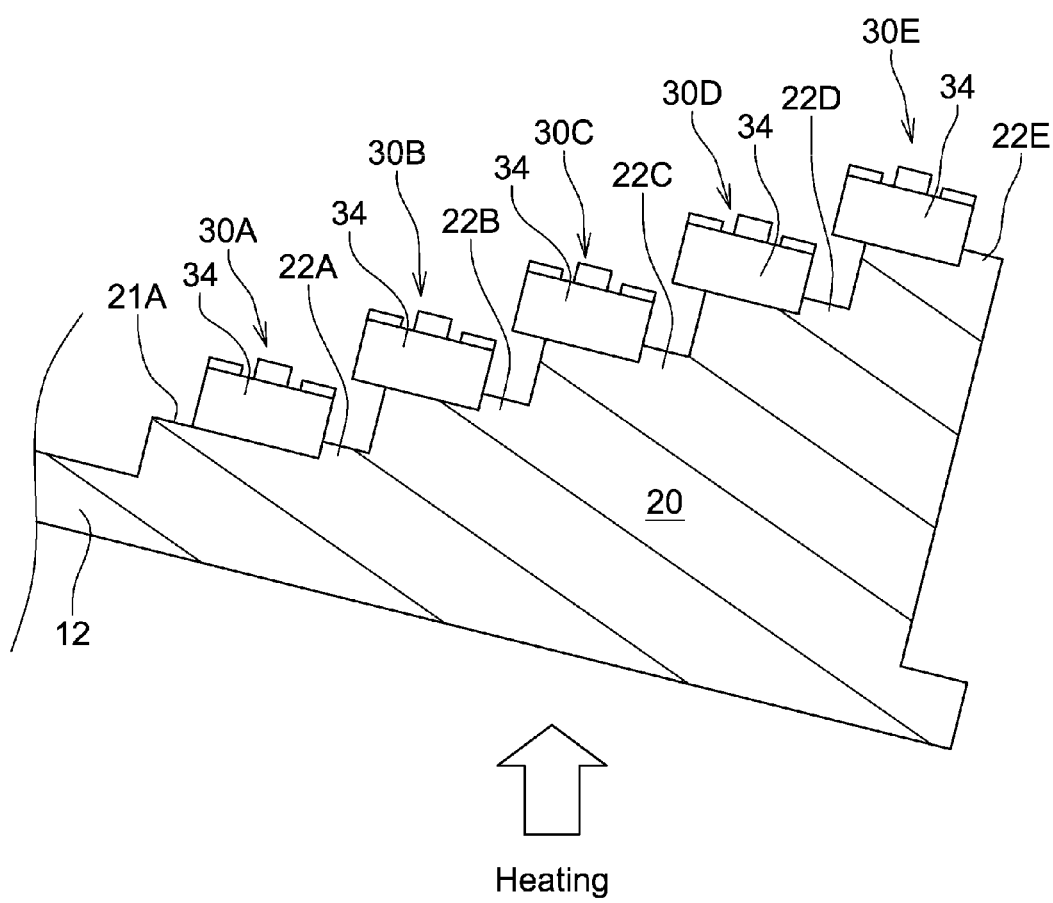
FIG. 8 is a diagram showing a manufacturing method of the semiconductor laser module illustrated in FIG. 2.

After placement of the semiconductor laser devices 30A-30E, as shown in FIG. 8, the bottom plate 12 is inclined downward on the right side. This operation causes the semiconductor laser devices 30A-30E to move obliquely downward to the right side on the inclined mount surfaces 21A-21E, so that the respective mounts 34 abut on the left side surfaces of the protrusion portions 22A-22E. Thus, the semiconductor laser devices 30A-30E are positioned in a collective manner. As show in FIG. 8, while this state is maintained, the bottom plate 12 is heated to melt the solder sheets 70. In this manner, the semiconductor laser devices 30A-30E are collectively solder-bonded to the mount base 20. Finally, a cover member 15 (see FIGS. 2 and 3) is fixed to a peripheral portion of the bottom plate 12. Thus, the semiconductor laser module 1 is completed.

As described above, according to a manufacturing method of one or more embodiments, provision of the protrusion portions 22A-22E in the mount base 20 allows the semiconductor laser devices 30A-30E to be positioned in a collective manner merely by inclination of the mount base 20. In this state, the semiconductor laser devices 30A-30E can be bonded collectively to the mount base 20 by heating the bottom plate 12. Accordingly, a small-sized, high-power semiconductor laser module in which a dielectric breakdown is unlikely to occur can readily be manufactured.

In the above manufacturing method, the bottom plate (mount base) may not necessarily be inclined. Even of the mount base is inclined, the provision of the positioning structures (protrusion portions) allows the semiconductor laser devices to abut on the positioning structures so that the semiconductor laser devices can be positioned. Accordingly, an inhibition space can readily be formed.

From the viewpoint of manufacturing a small-sized, high-power semiconductor laser module in which a dielectric breakdown is unlikely to occur, even the positioning structure may not necessarily be provided on the mount base. In this case, the lower semiconductor laser device is placed on and fixed (solder-bonded) to a mount surface (lower mount surface) on which the lower semiconductor laser device is mounted, such that an inhibition space is formed between the mount base and the electrically conductive portion of the lower semiconductor laser device. The upper semiconductor laser device is fixed (solder-bonded) to a mount surface (upper mount surface) on which the upper semiconductor laser device is mounted, such that a portion of the upper semiconductor laser device protrudes from the upper mount surface toward the lower semiconductor laser device.

As a matter of course, the above manufacturing method can be applied to the semiconductor laser module 100 and any semiconductor laser module having other positioning structures.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

The terms "below," "above," "bottom," "upward," "downward," "upper," "lower," and other positional terms described herein are used in connection with the illustrated embodiments and may be varied depending on the relative positional relationship between components of the apparatus.

The present invention may be used for a semiconductor laser module having a plurality of semiconductor laser devices.

REFERENCE SIGNS LIST 1, 100 Semiconductor laser module
10, 110 Housing
11 Frame
12, 112 Bottom plate
15 Cover member
16 Cover body
20, 120 Mount base
21A-21E Mount surface
22A-22E Protrusion portion (positioning structure)
23A-23D Step side surface
30A-30E Semiconductor laser device
31 Semiconductor chip (emission portion)
32 Left electrode pad (electrically conductive portion)
33 Right electrode pad (electrically conductive portion)
34 Mount
40 Fast-axis collimator lens (optical system)
41 Slow-axis collimator lens (optical system)
42 Reflection mirror (optical system)
43 Condenser lens (optical system)
44 Optical fiber
44A Incident end face
45 Fiber mount
46 Solder
70 Solder sheet
122B, 122C Boundary (positioning structure)
123A-123E Inclination surface
SA-SE Inhibition space

The invention claimed is:

1. A semiconductor laser module comprising:
an optical fiber;
a plurality of semiconductor laser devices each comprising:
an emission portion that emits a laser beam;
an electrically conductive portion that supplies electric power to the emission portion; and
a mount on which the emission portion and the electrically conductive portion are disposed;
a mount base comprising steps that each have a mount surface on which the respective mounts of the plurality of semiconductor laser devices are disposed; and
an optical system that optically couples the laser beams from the emission portions to an incident end face of the optical fiber, wherein
the optical fiber outputs the laser beams to an exterior of the semiconductor laser module,
the plurality of semiconductor laser devices includes an upper semiconductor laser device and a lower semiconductor laser device adjacent to each other in a step direction of the mount base, and
a portion of the mount of the upper semiconductor laser device protrudes, from the mount surface on which the upper semiconductor laser device is disposed, toward the lower semiconductor laser device.

2. The semiconductor laser module according to claim 1, wherein an inhibition space below the portion of the upper semiconductor laser device inhibits a dielectric breakdown between the mount base and the electrically conductive portion of the lower semiconductor laser device.

3. The semiconductor laser module according to claim 2, wherein a shortest separation distance from the mount base to the electrically conductive portion of the lower semiconductor laser device in the inhibition space is no shorter than an inhibition distance with which a dielectric breakdown is inhibited between the electrically conductive portion of the lower semiconductor laser device and the mount base.

4. The semiconductor laser module according to claim 3, wherein the inhibition distance Lc (mm) satisfies Lc≥P/R where P (kV) is a required withstand voltage of the semiconductor laser module and R (kV/mm) is an insulation resistance of the inhibition space.

5. The semiconductor laser module according to claim 4, wherein
the inhibition space is formed by air, and
the inhibition distance Lc satisfies Lc≥P/3.

6. The semiconductor laser module according to claim 2, wherein the mount base further comprises a positioning structure that positions the plurality of semiconductor laser devices and forms the inhibition space.

7. The semiconductor laser module according to claim 6, wherein the positioning structure comprises a protrusion portion that projects upward from the mount surface such that the mount of one of the plurality of semiconductor laser devices abuts on the protrusion portion.

8. The semiconductor laser module according to claim 6, wherein
the mount base has an inclination surface extending obliquely upward from the mount surface, and
the positioning structure comprises a boundary between the mount surface and the inclination surface.

9. The semiconductor laser module according to claim 1, wherein the mount surface of the mount base extends to at least a location directly below the emission portion of the semiconductor laser device mounted on the mount surface.

10. A method of manufacturing a semiconductor laser module that includes a mount base comprising mount surfaces that include an upper mount surface and a lower mount surface adjacent each other in a step direction, where the mount surfaces are formed in steps, the method comprising:
placing and fixing a lower semiconductor laser device onto the lower mount surface such that an inhibition space is formed between the mount base and an electrically conductive portion of the lower semiconductor laser device, wherein the inhibition space inhibits a dielectric breakdown between the electrically conductive portion of the lower semiconductor laser device and the mount base; and
placing and fixing onto the upper mount surface an upper semiconductor laser device that comprises an emission portion that emits a laser beam and a mount on which the emission portion is disposed such that a portion of the mount of the upper semiconductor laser device protrudes from the upper mount surface toward the lower semiconductor laser device.

11. The method of manufacturing a semiconductor laser module according to claim 10, further comprising:
placing a positioning structure on the mount surfaces to position the upper and lower semiconductor laser devices and form the inhibition space.

12. The method of manufacturing a semiconductor laser module according to claim 11, further comprising:
after placing the upper semiconductor laser device onto the upper mount surface and placing the lower semiconductor laser device onto the lower mount surface, inclining the mount base to bring the upper semiconductor laser device and the lower semiconductor laser device into abutment on the positioning structure, wherein
while the upper semiconductor laser device and the lower semiconductor laser device abut on the positioning structure, the upper semiconductor laser device and the lower semiconductor laser device are fixed to the upper mount surface and the lower mount surface, respectively.

13. The semiconductor laser module according to claim 2, wherein the mount surface of the mount base extends to at least a location directly below the emission portion of the semiconductor laser device mounted on the mount surface.

* * * * *